United States Patent
Matsuda et al.

(10) Patent No.: US 6,255,223 B1
(45) Date of Patent: Jul. 3, 2001

(54) SUBSTRATE HANDLING METHOD AND APPARATUS, AND ATTRACTIVE FORCE INSPECTION METHOD AND APPARATUS USED THEREWITH

(75) Inventors: Izuru Matsuda, Kadoma; Hideo Haraguchi, Toyonaka; Shigeyuki Yamamoto, Nara, all of (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 0 days.

(21) Appl. No.: 09/266,656

(22) Filed: Mar. 11, 1999

(30) Foreign Application Priority Data

Mar. 12, 1998 (JP) .................................................. 10-061318

(51) Int. Cl.[7] .............................. H02N 13/00; H05F 3/00; B23B 5/22; B23B 31/28
(52) U.S. Cl. ......................... 438/716; 118/500; 118/728; 156/345; 361/234; 279/128
(58) Field of Search .................................... 118/728, 500; 156/345; 204/280, 297 M; 414/935; 361/234; 279/128; 438/714, 716

(56) References Cited

U.S. PATENT DOCUMENTS

| | | | |
|---|---|---|---|
| 5,310,453 | * 5/1994 | Fukasawa et al. | 156/643 |
| 5,557,215 | * 9/1996 | Saeki et al. | 324/765 |
| 5,684,669 | * 11/1997 | Collins et al. | 361/234 |

FOREIGN PATENT DOCUMENTS

| | | |
|---|---|---|
| 63-72877 | 4/1988 | (JP) . |
| 3102820 | 4/1991 | (JP) . |

* cited by examiner

Primary Examiner—Gregory Mills
Assistant Examiner—A. Powell
(74) Attorney, Agent, or Firm—Price and Gess

(57) ABSTRACT

Data related to an attractive force between a substrate holder 3 and a substrate 2 is detected when pushing up and releasing the substrate 2 from the substrate holder 3, and when the attractive force is detected to be greater than a predetermined value, the push-up operation is regulated by a controller 18.

6 Claims, 2 Drawing Sheets

SUBSTRATE HANDLING METHOD AND APPARATUS, AND ATTRACTIVE FORCE INSPECTION METHOD AND APPARATUS USED THEREWITH

BACKGROUND OF THE INVENTION

1. Field of the Invention

The present invention relates to a substrate handling method and apparatus, and an attractive force inspection method and apparatus utilized therewith, used in a state wherein an attractive force is generated between a substrate and a substrate holder when the substrate as an object to be processed is held on the substrate holder where various processing is performed, for example, during plasma processing utilized in thin film formation, micro-fabrication and the like in the manufacture of semiconductor devices, liquid crystal display panels, solar cells and the like.

2. Description of the Related Art

To enhance device functionality, and reduce the processing costs thereof, efforts have been energetically undertaken in recent years to make plasma processing apparatus more accurate and faster, and to handle larger diameter process objects, while reducing damage. Of these, control of substrate temperature to achieve inplane uniformity and precision is required in particular to achieve uniform film quality in a substrate during film growth, and to ensure dimensional precision in the dry etching utilized in micro-fabrication, respectively. Plasma processing apparatuses that make use of either a mechanical clamp or an electrostatic attraction electrode have begun to be used as means for controlling the substrate temperature.

As examples of conventional plasma processing apparatus, there are such type as disclosed in Japanese Laid-open Patent Application No. 63-72877, Japanese Laid-open Patent Application No. 02-7520, Japanese Laid-open Patent Application No. 03-102820, and Japanese Laid-open Patent Application No. 04-100257.

FIG. 2 shows a cross-sectional view of the reaction chamber of a plasma processing apparatus disclosed in Japanese Patent Laid-open No. 04-100257. In this plasma processing apparatus, a vacuum chamber 131 having a gas feeding means 140, gas inlet 140a, and an evacuating mechanism 141 is utilized as the plasma processing reaction chamber. A substrate 132 to be processed is placed on top of an electrostatic attraction electrode 133 provided inside the vacuum chamber 131, and this substrate 132 is electrostatically attracted by the electrostatic attraction electrode 133. This electrostatic attraction is performed by applying from a direct current power source 134 a positive voltage and a negative voltage, respectively, to a pair of electrodes inside the electrostatic attraction electrode 133. In this state, ordinary plasma processing is performed on the substrate 132 by evacuating the inside of the vacuum chamber 131 to achieve a predetermined vacuum state, introducing reactive gases, and applying voltage. Plasma processing involves the generation of a plasma gas inside the vacuum chamber 131 by applying a high-frequency voltage from a high-frequency power source 136, and includes sputtering for forming a thin film which corresponds to the plasma gas constituents, dry etching for forming a conductive pattern by using the plasma gas to selectively remove in accordance with a photoresist a conductive layer on a semiconductor wafer, and ashing for removing unnecessary photoresist subsequent to dry etching.

Following this type of plasma processing, an electric charge remains in the dielectric layer of the surface of the electrostatic attraction electrode 133 even when the direct current power source 134 is shut off, and in some cases, an electric charge remains in the substrate 132 if it is of dielectric properties. For this reason, the substrate 132 continues to be electrostatically attracted to the electrostatic attraction electrode 133, and even when pushed upward by a push-up mechanism 139, the substrate 132 either cannot be released from the electrostatic attraction electrode 133, or incurs damage.

Accordingly, in this apparatus, when plasma processing is complete, the polarity of the applied voltage from the direct current power source 134 to the electrostatic attraction electrode 133 is reversed by a switching mechanism 135, thereby canceling the residual electric charge of the electrostatic attraction electrode 133, following which the substrate 132 is pushed upward and released from the electrostatic attraction electrode 133 by the push-up mechanism 139 so that it can be transported to the next process. Thereafter, ultraviolet rays are irradiated through a piece of quartz glass 138 onto the dielectric layer of the surface of the electrostatic attraction electrode 133 from, for example, a mercury lamp, which is an ultraviolet light source 137, thereby ultimately removing the residual electric charge on the surface of this dielectric layer in preparation for the next substrate to undergo plasma processing.

Conversely, instead of the above-described charge removal, a charge removing plasma process can also be performed. As an example of this kind of processing, there is a method, in which the residual electric charge is reduced by gradually lowering the applied power.

However, with the system in which charge removal is performed by reversing the polarity of the applied direct current voltage to the electrostatic attraction electrode 133 following plasma processing, it is difficult to remove completely but not excessively the residual electric charge. Consequently, there are cases in which either a residual electric charge remains, or a reverse polarity charge is applied, and the substrate 132 remains electrostatically attracted as-is. In a state such as this, if the substrate 132 is pushed up by the push-up mechanism 139, there is the danger that the process substrate 132 will be damaged. Further, transport trouble, such as the inability to transport, bad transport attitude, droppage, and improper loading at the next process, can occur when the substrate 132 is transported to the next process, thus lowering reliability.

Conversely, with the charge removing plasma process, because data related to the electrostatic attractive force is not directly monitored, the plasma discharge duration is set to last somewhat longer, causing a drop in throughput efficiency. Moreover, with charge removing plasma processing which is performed inside the vacuum chamber, dust is generated from the vacuum chamber caused by micro-sputtering, and there occurs impurities contamination and dust generation from the electrode material, which also leads to reduced quality and reliability.

Furthermore, the above-described electrostatic attraction between the substrate 132 to be processed and the electrostatic attraction electrode 133, and the problems associated therewith, are also caused by the plasma gas generated by a plasma generating apparatus inside the vacuum chamber for performing plasma processing on the substrate 132.

An object of the present invention is to provide a substrate handling method and apparatus, and an attractive force inspection method and apparatus utilized therewith, by which a substrate can be gently pushed up and released at proper timing from a substrate holder in accordance with the residual state of an attractive force generated between the substrate holder and the substrate which is supported and processed on the substrate holder.

SUMMARY OF THE INVENTION

To achieve the above-described object, the substrate handling method of the present invention includes a process of pushing up the substrate thereby releasing the substrate from the substrate holder, wherein, when pushing up and releasing the substrate from the substrate holder, data related to an attractive force generated on the substrate to the substrate holder is detected, and when the attractive force is detected to be greater than a predetermined value, the push-up operation is regulated.

Attractive force occurs, for example, as a result of the substrate holder and the substrate being electrically charged because of plasma processing, or when the substrate is electrostatically attracted to and held on the substrate holder by applying a direct current voltage to the substrate holder.

The above-mentioned attractive force which remains between the substrate and the substrate holder can be detected based on, for example, a push-up load when pushing up and releasing the substrate from the substrate holder. This push-up load can be detected by providing to the push-up transfer portion of a push-up system utilized in combination with the substrate holder, for example, various kinds of detectors for reacting electrically, physically, or chemically with the push-up load exerted by the push-up system, and observing the reactive state thereof electrically, mechanically, or optically. By so doing, it is possible to determine either manually or automatically by means of an electrical or mechanical determining means corresponding to the type of data, from the detected data whether or not the attractive force during substrate push-up is greater than a predetermined value. As an electrical detector, a load cell may be used, for example, which directly outputs attractive force-related data as electrical signals, making possible a ready determination thereof by an electrical determining means. However, attractive force detection is not limited to the above-described detection system. Rather, attractive force can be detected, for example, irrespective of the push-up operation.

Here, as described above, when the substrate is pushed up and released from the substrate holder, data related to the attractive force between the substrate holder and the substrate is detected, and when the detected attractive force is greater than a predetermined value, push-up is controlled so that the substrate can be pushed up and released from the substrate holder at proper timing in accordance with the residual state of the attractive force between the substrate holder and the substrate. By this method, substrate damage is eliminated, and transport trouble, such as the inability to transport, bad transport attitude, droppage, and improper loading at the next process, can be avoided when transporting the substrate to the next process, thereby enhancing reliability. Moreover, since release timing becomes the minimum time required, loss time can be eliminated, and throughput efficiency can be enhanced.

In particular, when the substrate is pushed up from the substrate holder, data related to the attractive force of the substrate holder on the substrate at the push-up thereof is detected based on the push-up load, and in case the attractive force is detected to be greater than a predetermined value, push-up operation is stopped. Thereafter, push-up and stopping are repeated until the attractive force drops below the predetermined value, only when the substrate is completely released. In this way, each time the substrate is pushed up and stopped while controlling the push-up of the substrate in accordance with the attracted state of the substrate to the substrate holder, the contact portion of the substrate with the substrate holder is separated first slightly, after which, as this separating portion gradually expands, the attractive force of the substrate holder decreases, enabling the substrate to be gently released yet more quickly, and further enhancing throughput efficiency.

As an apparatus for realizing such a substrate handling method, the substrate handling apparatus of the present invention comprises: a substrate holder, which holds and furnishes a substrate to various processes; a push-up system, which pushes up the substrate thereby releasing the substrate; a detector for detecting data related to an attractive force generated between the substrate and the substrate holder based on a push-up load when the push-up system pushes up the substrate; and a controller for controlling operation of the push-up system, wherein the push-up system is controlled such that, when the attractive force is detected to be greater than a predetermined value on the basis of the push-up load, the push-up system is paused, and thereafter push-up and pause are repeated until the attractive force is below the predetermined value, when the push-up system ultimately pushes up the substrate to release the substrate completely from the substrate holder. The controller may be of any type so long as it has such a determination function as mentioned above as either an internal function or an external function.

If the detector for detecting as attractive force-related data the push-up load exerted by the push-up system is provided part way along the push-up force transfer system of the push-up system, and connected onto the drive force transfer axis of the driver, the operation, in which the push-up system is pushed up by the driver, acts with precision on the detector, enabling the push-up load at that time to be detected accurately.

By providing a construction such that the substrate holder is disposed inside the vacuum chamber, which places the process work area in a vacuum state, whereas the detector is provided on the atmosphere side outside the vacuum chamber, thereby being located more than a certain distance away from the substrate holder and not electrically connected thereto, the detector will not be affected by the vacuum state, the difference in pressure inside and outside the vacuum chamber, nor the electrical effects from the substrate holder side, making possible more precise detection. And being outside the vacuum chamber facilitates characteristic adjustments and repairs, replacement and other such maintenance.

DESCRIPTION OF PREFERRED EMBODIMENTS

Preferred embodiments of the present invention will be described hereinbelow with reference to the accompanying drawings.

The substrate handling method and apparatus therefor according to this embodiment described below are one example of when a substrate to be processed is a silicon wafer, and reactive ion etching-type plasma dry etching is performed thereon. It should be noted, however, that the present invention can be applied in common to all sorts of substrate handling, in which problems associated with a push-up operation when separating, from the substrate holder, the substrate that keeps being attracted to the substrate holder during or following the processing, must be addressed.

Figure 1:
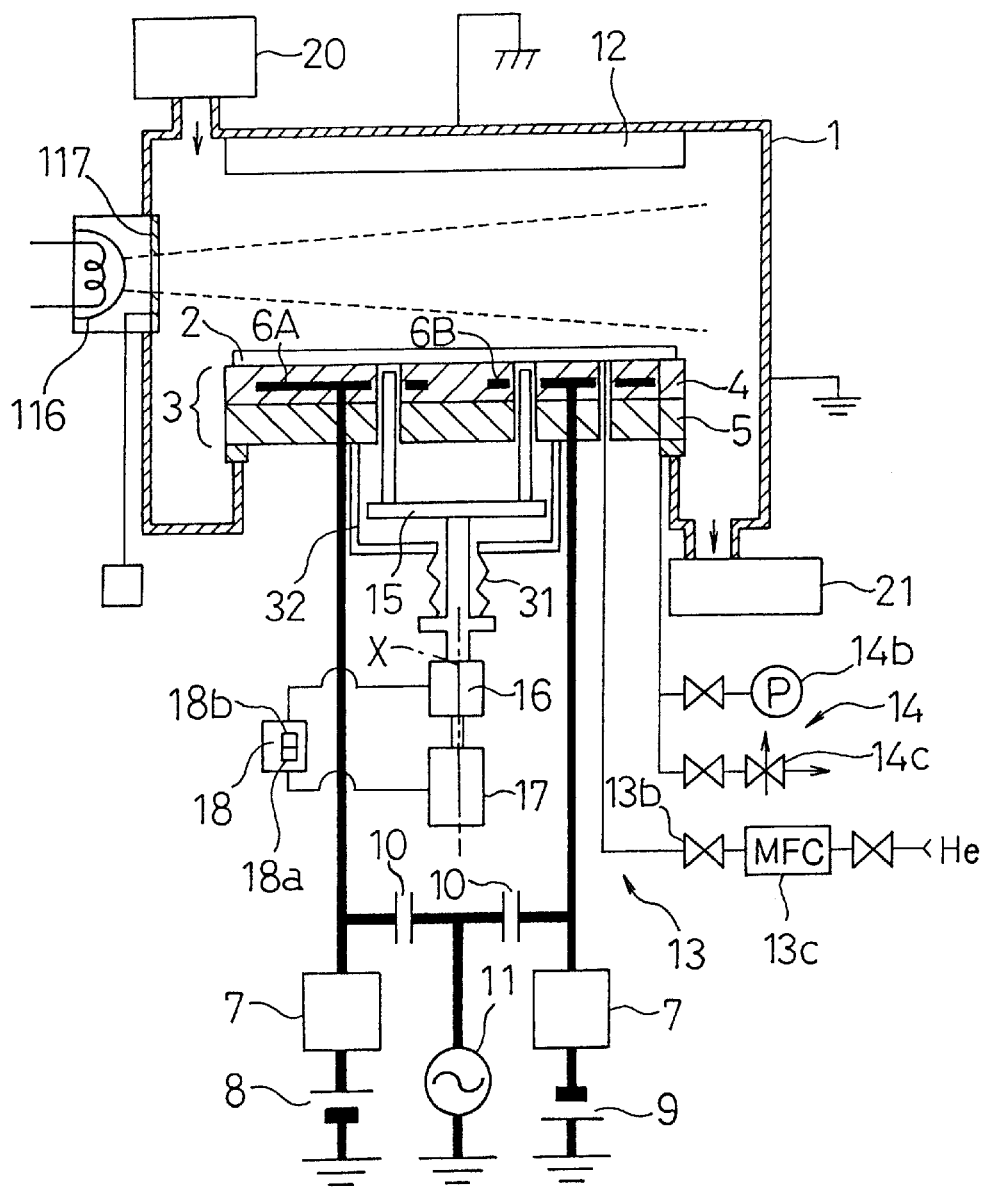
FIG. 1 is a cross-sectional view showing one embodiment of a dry etching apparatus to which the substrate handling method and apparatus of the present invention pertain.
Figure 2:
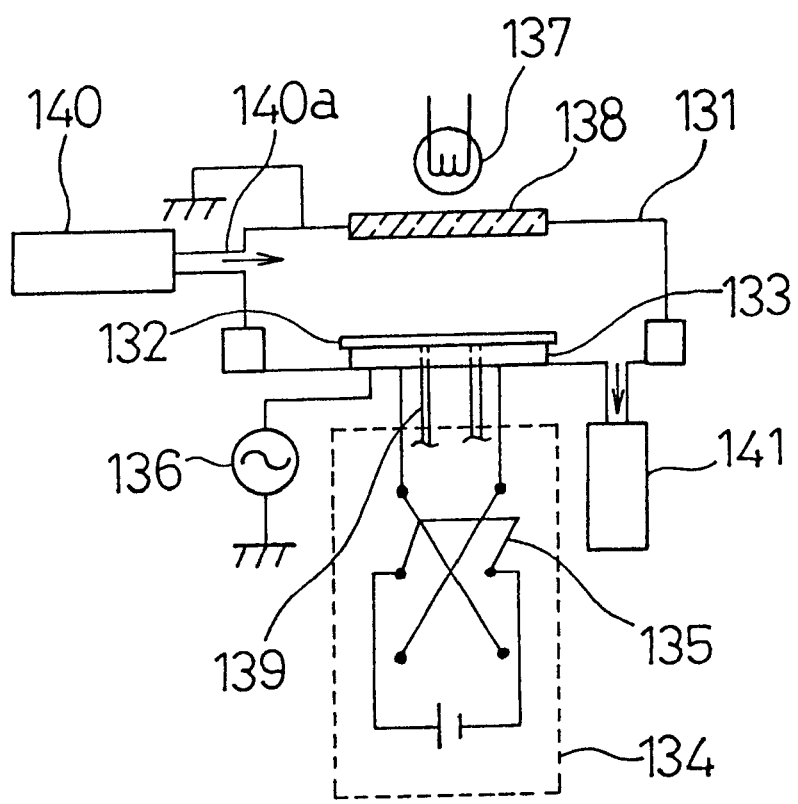
FIG. 2 is a cross-sectional view showing a conventional dry etching apparatus.

A wafer 2 handling method is described by referring to FIG. 1 which shows the apparatus of this embodiment. A wafer 2 is held on an electrostatic attraction electrode that serves as the substrate holder 3 of an electrostatic attraction-type plasma apparatus, and after being furnished with a variety of processes, such as ashing, and sputtering, in addition to the above-mentioned plasma etching, the wafer 2 is pushed up and released from the substrate holder 3 by a push-up mechanism 15, and is transported to the next process and otherwise prepared for subsequent processing. When the wafer 2 is pushed up by the push-up mechanism 15, data related to the attractive force of the substrate holder 3 on the wafer 2 is detected by a detecting means 16, and the push-up operated is regulated when the attractive force is greater than a predetermined value. It should be noted that push-up of the wafer 2 may be started before the processing is completed.

By this method, the wafer 2, which is supported and processed while being electrostatically attracted to the substrate holder 3, can be gently pushed up and released at a proper timing from the substrate holder 3 in accordance with the residual state of the attractive force. The substrate is thus prevented from being damaged, and transport trouble, such as the inability to transport, bad transport attitude, droppage, and improper loading at the next process, is avoided during transport to the next process, enabling enhanced reliability. Moreover, since release timing is held to the minimum time required, loss time can be eliminated, and throughput efficiency can be enhanced. Further, unlike the case where problems resulting from electrostatic attraction are dealt with the conventional charge removing plasma system, no dust is generated from the vacuum chamber 1 due to micro-sputtering, and there is no dust generation and impurities contamination from the electrode materials inside the vacuum chamber 1 such as the substrate holder 3 and upper electrode opposite thereto.

Attractive force, for example, is generated either by the electrification of the substrate holder 3 and/or the wafer 2 resulting from plasma processing, or occurs as a result of the substrate holder 3 and the wafer 2 being electrically charged when the wafer 2 is electrostatically attracted and held by applying a direct current voltage to the substrate holder 3. Since the substrate holder 3 is an electrostatic attraction type in this embodiment, it copes with electrostatic attraction generated mainly by the latter cause. However, the above-described method can be effectively applied to the cases where electrostatic attractive force is generated as a result of plasma processing, or where the wafer 2 keeps to be attracted to the substrate holder 3 due to any other reasons.

The wafer 2 handling apparatus for implementing the wafer 2 handling method such as that described above may comprise the substrate holder 3 for holding and furnishing the wafer 2 to various processes; the push-up mechanism 15, which pushes up and releases the substrate holder 3-held wafer 2; detecting means 16 for detecting data related to the attractive force of the substrate holder 3 on the wafer 2 when the push-up mechanism 15 pushes up the wafer 2; and controlling means 18 for controlling the push-up operation of the push-up mechanism 15 when the attractive force at that time is determined from the data detected thereby to be greater than a predetermined value. By this arrangement, the wafer 2 handling method such as that described above can be automatically performed, and required processing can be implemented in a continuous manner. For the above mentioned control of push-up operation, controlling means 18 includes a determining means 18a, as either an internal function or an external function of the controlling means 18 for performing the above-mentioned determination.

The attractive force can be detected based on the push-up load, for example, when pushing up and releasing the wafer 2 from the substrate holder 3. For detecting the push-up load, detecting means 16 is provided to a portion of the push-up transfer system of the push-up mechanism 15, which is utilized in combination with the substrate holder 3. Various detecting means may be employed so long as it is of such type as to react, for example, electrically, physically, or chemically with the load at push-up by the push-up mechanism 15, of which reactive state is then electrically, mechanically, or optically monitored. By so doing, the above-mentioned determination as to whether or not the attractive force at the present time is greater than a predetermined value, can be automatically performed on the basis of the detected data in accordance with the type of data, using electrical, or mechanical determining means 18a. In this embodiment, a load cell is used as electrical detecting means 16, by which attractive force-related data is directly outputted as electrical signals, making possible a ready determination thereof by electrical determining means 18a. For the electrical determining means 18a, a dedicated electrical circuit or an internal function of controlling means 18 which is a microcomputer or the like may be utilized.

To detect push-up load by the push-up mechanism 15 as attractive force-related data, detecting means 16 is provided to a portion of the push-up force transfer system of the push-up mechanism 15 as mentioned above, and is connected thereto along the drive force transfer axis X of drive means 17, which causes the push-up mechanism 15 to perform, for example, a vertical push-up operation. With this arrangement, the push-up operation of the push-up mechanism caused by the drive means 17 acts precisely on detecting means 16, enabling the push-up load at that time to be 15 accurately detected. Drive means 17 may be a direct-drive electric motor, hydraulic cylinder, air cylinder, solenoid or some other linear-operation actuator itself, or, means for converting the rotating operation of an actuator to linear motion may be also acceptable. Further, if a torque limiter mechanism is used which controls push-up by generating slippage in the transfer of the drive force when attractive force is detected to be greater than a predetermined value, it will constitute controlling means which possesses both functions of detecting means and determining means, whereby the constitution will be simplified. Moreover, the resistance force generated by the occurrence of the above-mentioned slippage also acts to reduce attractive force while the wafer 2 is gradually pushed up from the substrate holder 3 and the released portion thereof is spread out in the surrounding vicinity. Further, making a maximum value of torque of the drive means 17 for transferring the drive force variable enables flexible use thereof, and makes adjustments according to actual needs possible.

As one example, the control of push-up operation may be made such that, when push-up load acted on the wafer 2 by the push-up mechanism 15 is detected by detecting means 16, and if the attractive force is determined to be greater than a predetermined value based on the detected push-up load, push-up is once stopped, and push-up and stopping are repeated thereafter, whereby it is possible to achieve release of the wafer 2 at the point in time when the attractive force drops below the predetermined value. By so doing, each time push-up and stopping are performed, push-up force is exerted on the portion where the wafer 2 and push-up mechanism make contact, and this contact portion is first separated slightly from the substrate holder 3. Thereafter, as this separation portion gradually expands in that vicinity, i.e., as the contact portion with the substrate holder 3 diminishes, the attractive force decreases, wherefore it is possible to release the wafer 2 more quickly but not forcibly from the substrate holder 3, enabling throughput efficiency to be further enhanced. Such control may be performed by the control means 18 in the substrate handling apparatus instead of the above-described push-up load control.

As shown in FIG. 1, since the substrate holder 3 is provided inside the vacuum chamber 1, which places the process work area in a vacuum state, whereas detecting means 16 is provided on the atmosphere side outside the vacuum chamber 1, is located more than a certain distance from the substrate holder 3, and is not electrically connected to the substrate holder 3, wherefore detecting means 16 is not affected by the vacuum state, the difference in pressure inside and outside the vacuum chamber 1, nor the electrical effects from the substrate holder 3 side, making possible more precise detection. Further, being outside the vacuum chamber 1 makes adjustments, and repairs, replacement and other such maintenance easier.

The wafer 2 handling apparatus shown in FIG. 1 as one example will be described in detail. The electrostatic attraction-type substrate holder 3 comprises an approximately 5 mm thick alumina dielectric portion 4, and an aluminum base portion 5 which has a water cooling channel on the inside (not shown), and is equipped with a pair of internal electrodes 6A, 6B for electrostatic attraction. The electrodes 6A, 6B are made of tungsten, and are positioned 500 $\mu$m from the surface of the alumina dielectric portion 4. Positive and negative voltage is applied to the corresponding internal electrodes 6A, 6B via separate high-frequency filters 7 from a positive electrode direct current power source 8, and a negative electrode direct current power source 9. Separate capacitors 10 for the positive electrode and negative electrode are provided at portions on the internal electrodes 6A, 6B side with respect to the high-frequency filters 7, and high-frequency voltage can be applied to the internal electrodes 6A, 6B via the respective capacitors 10 from a 13.56 MHz high-frequency power source 11. The high-frequency filters 7 function to prevent a reverse flow of direct current voltage applied from the positive and negative electrode direct current power sources 8, 9, and the capacitors 10 prevent the direct current voltage from being applied to the high-frequency power source 11. An upper electrode 12 is provided, that is grounded, in a location opposite the internal electrodes 6A, 6B of the substrate holder 3 in the upper portion of the inside of the vacuum chamber 1, and reactive gases fed into the vacuum chamber 1 are made into a plasma by applying the above-mentioned high-frequency voltage therebetween.

A feed mechanism 13 is provided for supplying a heat transfer gas, such as helium (He) gas, for example, between the front side and back side of the substrate holder 3, which comprises a valve 13b and a flow controller 13c. Correspondingly thereto, a pressure monitoring/control mechanism 14 for monitoring and controlling the pressure of the heat transfer gas on the backside of the wafer 2 is also provided, which comprises a pressure gauge 14b and a throttle valve 14c. The push-up mechanism 15 is provided such as to be able to pass through the inside of the substrate holder 3 from bottom to top, and is ordinarily hidden from sight inside the substrate holder 3, as shown in FIG. 1, but upon (or before) completion of processing of the wafer 2, which is electrostatically attracted and held on the top of the substrate holder 3, the push-up mechanism 15 is made to protrude to the upper surface of the substrate holder 3, pushing the wafer 2 upward from the backside thereof, and releasing it from the substrate holder 3. The portion of the push-up mechanism 15 that passes through the substrate holder 3 is sealed on the outside thereof either by a bellows 31 alone or jointly by a bellows 31 and casing 32.

The following is a description of one example of wafer 2 handling and processing operations implemented in such apparatus. First, the vacuum chamber 1 is evacuated using an evacuating means 21, and a wafer 2 is placed on top of the substrate holder 3. Next, the wafer 2 is electrostatically attracted and held on the top surface of the substrate holder 3 by applying a 1.0 kV positive and negative direct current voltage via high-frequency filters 7 to the pair of internal electrodes 6A, 6B from direct current power sources 8, 9.

Then, 10 cc/min of He gas is introduced to the backside of the wafer 2 by the He feed mechanism 13, and pressure is adjusted to 10 Torr by the pressure control mechanism 14. Further, 30 cc/min of $CF_4$ and 5 cc/min of $O_2$, which are the reactive gases, are simultaneously introduced by a gas feeding means 20, and pressure is adjusted to 200 mTorr. Then high frequency voltage is supplied to the pair of internal electrodes 6A, 6B via the capacitors 10 from the high-frequency power source 11, by which a plasma is generated between the pair of internal electrodes 6A, 6B and the upper electrode 12, and the desired dry etching is achieved, while the wafer 2 is efficiently cooled by the He gas on the backside thereof.

After etching is complete, the supplies of high-frequency power, reactive gases, and He gas for cooling the backside of the wafer 2 are stopped, and the output of the direct current power sources 8, 9 is once shut off while evacuation is performed. At this time when the desired wafer etching has been completed, the wafer 2 is still electrostatically attracted to the substrate holder 3 due to electrification of the wafer 2 resulting from plasma processing, and the residual charge that exists between the surface of the dielectric layer of the substrate holder 3 and the backside of the wafer 2. If an attempt is made as-is to release the wafer 2 from the substrate holder 3 by pushing up with the push-up mechanism 15 in order to transport the wafer 2, wafer 2 damage and transport trouble will occur. Such trouble tends to occur most often when the substrate to be processed is of a dielectric material.

Accordingly, a process for nullifying the attraction resulting from this residual charge is performed as described hereinbelow. First, as the initial setting, the wafer 2 is pushed up by the push-up mechanism 15 in a state where there is no residual charge. At this time, detecting means 16, which is a load cell, is subjected to a force that has reproducibility and is caused in combination by a pushing force from the atmosphere side as a result of the vacuum on the vacuum chamber 1 side, a spring force from the bellows 31 which forms a seal between the vacuum chamber 1 and the atmosphere, and the weight of the wafer 2. This data is monitored, and stored inside memory means 18b, which is an internal function of controlling means 18 or the like. Since this stored initial setting value is highly repeatable, there is no need to make revisions until the push-up mechanism 15 is broken down and reassembled.

Next, the wafer 2 is caused to be attracted to the substrate holder 3, after which drive means 17 of the push-up mechanism 15 is operated so as to push up the wafer 2. Since an attractive force is generated due to a residual charge or the like, detecting means 16, which is a load cell, detects a force that is greater than the initial setting value, when the push-up mechanism 15 comes in contact with the wafer 2.

Here, since the detecting means 16 is affixed coaxially on the drive force transfer axis X of the push-up mechanism 15, and can accurately measure an external force other than the attractive force, the attractive force can be measured by itself extremely well by operating so as to offset the external force portion. In experiments, the atmospheric pressure on the bellows 31 was 7 kgf, and the spring force of the bellows 31 when the push-up mechanism 15 made contact with the wafer 2 was 1.6 kgf, so the external force offset amount was set at 8.8 kgf.

Since detecting means 16 which is a load cell is located on the atmosphere side, load cell life is long, accuracy and reliability are good, and wiring and replacement work are highly convenient, adjustments are easy, and furthermore, there are no malfunctions of the load cell resulting from electrical noise since it is possible to maintain sufficient distance from the substrate holder 3, which is the high-frequency power application portion. Further, there is also no drop in high-frequency power efficiency. In the experiments, the distance between the substrate holder 3 and detecting means 16 was set at 280 mm.

To prevent wafer damage, push-up operation by the push-up mechanism 15 is stopped by controlling means 18 at the point when a predetermined value (20 kgf in the experiments) of less than the shearing stress limit of the substrate material is detected, and the push-up mechanism 15 is lowered. Then, either immediately, or after a predetermined period of time, the push-up mechanism 15 is raised, and the same operation is repeated. By this operation, the wafer 2 that is being held to the substrate holder 3 by a residual charge is first separated ever so slightly from the substrate holder 3 at the portion which makes contact with the push-up mechanism 15, following which, this separated portion gradually expands in the surrounding vicinity. Therefore, the portion of the wafer 2 that is in contact with the substrate holder 3 gradually decreases without being subjected to an excessive push-up force, and the residual charge between the surface of the alumina dielectric layer of the substrate holder 3 and the wafer 2 is also electrically neutralized having the residual He gas on the backside of the wafer 2 as a medium, and the residual charge-produced attractive force decreases.

When it has been detected by detecting means 16 that the attractive force resulting from a residual charge has been reduced to the point where it will not cause wafer damage or transport troubles, the wafer 2 is pushed up at the highest speed that will not cause misalignment, for example, 20 mm/sec. In the experiments, push-up commenced when attractive force was less than 1kgf.

Since the wafer 2 is quickly and accurately released as a result thereof, trouble-free, stable transport can be performed, and throughput efficiency is markedly enhanced. Moreover, because a charge removing plasma process is not used, and there is no high-voltage electrode or the like for corona discharge inside the vacuum chamber 1, there is no dust generated from the vacuum chamber 1 caused by micro-sputtering, no dust generation or impurities contamination from the electrode material, and nothing to induce device damage such as threshold voltage shift in a MOS transistor. Further, even in the unlikely event that attractive force still remains, since it is accurately detected and dealt with, there is no wafer 2 damage resulting from forced separation.

As an ultraviolet irradiating means for removing a residual charge from the substrate holder 3 and the like in the vacuum chamber 1, an ultraviolet lamp 116 and quartz glass 117 are provided.

Furthermore, as for detecting means 16, in addition to a load cell, as long as it is a device and system which is capable of detecting load and force, a variety of devices and systems can be used. Further, another inert gas can be substituted for the He gas supplied to the backside of the wafer 2. The supply tubing for these gases is not limited to the tubing structure shown in the figure. Rather, any tubing structure capable of supplying a gas to the backside of the wafer 2 in a suitable state is acceptable.

As for the electrostatic attraction electrode of the substrate holder 3, which electrostatically attracts the wafer 2, a bipolar type that uses two kinds of electrodes, a positive electrode and a negative electrode, was utilized in this embodiment, but a unipolar type electrode can be used in place thereof. Further, in case a substrate holder, which has its surface covered with a dielectric material, and which is either grounded or is supplied with high-frequency power is used instead of the electrostatic attraction electrode-type substrate holder 3 like this embodiment, especially when the substrate to be processed is a dielectric material, the problem of residual charge-produced attraction can occur. The present invention is effective in cases such as this as well.

Further, the apparatus of the embodiment is a reactive ion etching-type dry etching apparatus, but the plasma generation method is not limited thereto. Inductive coupling type, ECR type, helicon wave type, surface wave type and other plasma generation methods are also acceptable. Further, in place of a dry etching apparatus, the present invention can be effectively applied to a plasma CVD apparatus, a sputtering apparatus, and an ashing apparatus.

While a preferred embodiment of the invention has been described using specific terms, such description is for illustrative purposes only, and it is to be understood that changes and variations may be made without departing from the spirit or scope of the following claims.

What is claimed is:

1. A substrate handling method including processes of:
    pushing up a substrate that is held on a substrate holder and subjected to processing; and
    detecting data related to an attractive force generated between the substrate and the substrate holder based on a push-up load when the substrate is pushed up from the substrate holder; wherein,
        when the attractive force is detected to be greater than a reference value, push-up operation is stopped, and thereafter, the push-up operation is started and paused repeatedly, until the attractive force drops below the predetermined value, when the substrate is ultimately pushed up thereby being released from the substrate holder.

2. The substrate handling method according to claim 1, wherein the processing involves plasma processing performed inside a vacuum chamber.

3. The substrate handling method according to claim 1, wherein the attractive force is caused by electrification between the substrate and the substrate holder, resulting in the substrate being electrostatically attracted to and held on the substrate holder by applying a direct current voltage thereto.

4. A substrate handling method including the processes of:
a) holding a substrate on a substrate holder;
b) processing the substrate;
c) pushing up the substrate after the processing of the substrate has been completed;
d) detecting data related to an attractive force generated between the substrate and the substrate holder based on a push-up load when the substrate is pushed up from the substrate holder;
e) when the attractive force is greater than a reference value, pausing the push-up operation;
f) pushing up the substrate;
g) repeating steps d), e), and f), until the attractive force drops below the reference value;
h) releasing the substrate from the substrate holder; and
i) repeating steps a) through h).

5. The substrate handling method according to claim 4 wherein the processing involves plasma processing performed inside a vacuum chamber.

6. The substrate handling method according to claim 4, wherein the attractive force is caused by electrification the substrate and the substrate holder, resulting in the substrate being electostatically attracted to and held on the substrate holder by applying a direct current voltage thereto.

* * * * *